(12) United States Patent
Takane et al.

(10) Patent No.: US 11,780,767 B2
(45) Date of Patent: Oct. 10, 2023

(54) GLASS CERAMIC SINTERED BODY AND WIRING SUBSTRATE

(71) Applicant: TDK CORPORATION, Tokyo (JP)

(72) Inventors: Shin Takane, Tokyo (JP); Yousuke Futamata, Tokyo (JP); Kenichi Sakai, Tokyo (JP); Yasuharu Miyauchi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/923,552

(22) Filed: Jul. 8, 2020

(65) Prior Publication Data

US 2021/0009463 A1 Jan. 14, 2021

(30) Foreign Application Priority Data

Jul. 8, 2019 (JP) .................. 2019-127099

(51) Int. Cl.
*C03C 10/00* (2006.01)
*H01L 23/15* (2006.01)
(Continued)

(52) U.S. Cl.
CPC .......... *C03C 10/0009* (2013.01); *B32B 17/06* (2013.01); *C03C 10/0036* (2013.01);
(Continued)

(58) Field of Classification Search
CPC ............ C03C 10/0009; C03C 2204/00; B32B 3/266; B32B 17/06; B32B 2255/205; B32B 2307/202; B32B 2307/206; B32B 2311/08; B32B 2315/08; B32B 2457/08; H01L 23/15; H01L 23/49822; H01L 23/14; H05K 1/0306; H05K 1/0298; H05K 1/115; H05K 3/4629
See application file for complete search history.

(56) References Cited

U.S. PATENT DOCUMENTS 4,621,066 A * 11/1986 Nishigaki .............. H01G 4/129
257/E23.009
4,672,152 A * 6/1987 Shinohara ........... C03C 10/0027
174/258
(Continued)

FOREIGN PATENT DOCUMENTS

CN 107635940 A 1/2018
JP 2004-256346 A 9/2004
(Continued)

OTHER PUBLICATIONS

English Translation JP4325920, Published Sep. 2, 2009 (Year: 2009).*

*Primary Examiner* — Steven T Sawyer
(74) *Attorney, Agent, or Firm* — Oliff PLC

(57) ABSTRACT

A glass ceramic sintered body having a small dielectric loss in a high frequency band of 10 GHz or higher and a wiring substrate using the same are provided. The glass ceramic sintered body contains crystallized glass, an alumina filler, and silica. The content of the crystallized glass is 45 mass % to 85 mass %, the content of the alumina filler is 14.8 mass % to 50.1 mass % in terms of $Al_2O_3$, and the content of silica is 0.2 mass % to 4.9 mass % in terms of $SiO_2$.

15 Claims, 5 Drawing Sheets

(51) Int. Cl.
*H05K 1/03* (2006.01)
*B32B 17/06* (2006.01)
*H05K 1/02* (2006.01)

(52) U.S. Cl.
CPC .......... *C03C 10/0045* (2013.01); *H01L 23/15* (2013.01); *H05K 1/0306* (2013.01); *B32B 2307/206* (2013.01); *B32B 2315/08* (2013.01); *B32B 2457/08* (2013.01); *C03C 2204/00* (2013.01); *H05K 1/0298* (2013.01)

(56) References Cited

U.S. PATENT DOCUMENTS

| | | | | |
|---|---|---|---|---|
| 4,755,490 | A * | 7/1988 | DiLazzaro | H01L 21/4807 501/153 |
| 6,034,011 | A * | 3/2000 | Yamaguchi | C03C 10/0009 501/63 |
| 6,232,251 | B1 * | 5/2001 | Terashi | C03C 10/0009 257/E23.009 |
| 2002/0098965 | A1 * | 7/2002 | Terashi | H01L 23/49894 501/5 |
| 2003/0099062 | A1 * | 5/2003 | Kataoka | G11B 5/73921 |
| 2006/0105898 | A1 * | 5/2006 | Ide | C03C 3/15 501/15 |
| 2006/0142141 | A1 * | 6/2006 | Ishitobi | C04B 35/63 501/136 |
| 2010/0151217 | A1 * | 6/2010 | Kanada | H05K 3/4629 428/428 |
| 2011/0014423 | A1 * | 1/2011 | Yeh | C04B 35/481 501/153 |
| 2013/0240262 | A1 * | 9/2013 | Nagahiro | C04B 35/119 174/565 |
| 2014/0071645 | A1 * | 3/2014 | Glanz | C03C 14/00 361/771 |
| 2014/0206522 | A1 * | 7/2014 | Yano | C03C 3/093 501/5 |
| 2015/0030830 | A1 * | 1/2015 | Adachi | B32B 18/00 428/212 |
| 2016/0088729 | A1 * | 3/2016 | Kobuke | H05K 1/115 174/251 |
| 2016/0251249 | A1 * | 9/2016 | Backhaus-Ricoult | C04B 35/478 428/116 |
| 2018/0134613 | A1 * | 5/2018 | Kobuke | C01G 45/02 |
| 2018/0233242 | A1 * | 8/2018 | Heath | G21F 9/305 |

FOREIGN PATENT DOCUMENTS

| | | |
|---|---|---|
| JP | 4288656 B2 | 7/2009 |
| WO | 99/21803 A2 | 5/1999 |

* cited by examiner

GLASS CERAMIC SINTERED BODY AND WIRING SUBSTRATE

BACKGROUND OF THE INVENTION

Field of the Invention

The present invention relates to a glass ceramic sintered body and a wiring substrate using the same. More specifically, the present invention relates to a glass ceramic sintered body and a wiring substrate used for various module substrates, a semiconductor element accommodation package, and the like.

Description of the Related Art

Currently, the standardization of a fifth generation mobile communication system (hereinafter, referred to as 5G) is in progress. In 5G, in order to expand the frequency band, use of a frequency band of 10 GHz or higher, particularly a quasi-millimeter wave band of 10 to 30 GHz or a millimeter wave band of 30 to 300 GHz is under consideration.

As a bandpass filter that constitutes a microwave circuit component used in 5G, use of a low-temperature fired substrate or the like using a glass ceramic sintered body is under consideration. Wiring substrates using a glass ceramic sintered body can use a metal material having a low melting point and a low resistance, such as Cu or Ag, for the wiring of an inner layer.

The glass ceramic sintered body for the bandpass filter that constitutes a microwave circuit component used in 5G is required to have a small dielectric loss in a high frequency band of 10 GHz or higher.

For example, Japanese Patent No. 4288656 discloses a glass powder for a dielectric material having a property of depositing diopside, titanite and/or titania, and containing 35 to 65% of $SiO_2$, 10 to 30% of CaO, 10 to 20% of MgO and 12 to 30% of $TiO_2$ by mass.

However, because the glass powder for a dielectric material described in Japanese Patent No. 4288656 contains a large amount of $TiO_2$, dielectric loss tends to be higher in a high frequency band of 10 GHz or higher.

SUMMARY OF THE INVENTION

An object of the present invention is to provide a glass ceramic sintered body having a small dielectric loss in a high frequency band of 10 GHz or higher and a wiring substrate using the same.

The glass ceramic sintered body of the present invention for achieving the above object is as follows.

[1] A glass ceramic sintered body comprising crystallized glass, an alumina filler and silica, wherein the content of the crystallized glass is 45 mass % to 85 mass %, the content of the alumina filler is 14.8 mass % to 50.1 mass % in terms of $Al_2O_3$, and the content of the silica is 0.2 mass % to 4.9 mass % in terms of $SiO_2$.

The following aspects are exemplified as specific aspects of the above [1].

[2] The glass ceramic sintered body according to [1], wherein the crystallized glass has a deposit of a diopside type oxide crystal phase containing at least Mg, Ca and Si.

[3] The glass ceramic sintered body according to any one of [1] or [2], further comprising at least one selected from the group consisting of titanium oxide, calcium titanate and strontium titanate.

[4] The glass ceramic sintered body according to any one of [1] or [2], further comprising at least one of titanium oxide and calcium titanate.

[5] A wiring substrate having an insulating base and a wiring conductor, wherein the insulating base consists of the glass ceramic sintered body of any one of [1] to [4].

DETAILED DESCRIPTION OF THE PREFERRED EMBODIMENTS

Figure 1:
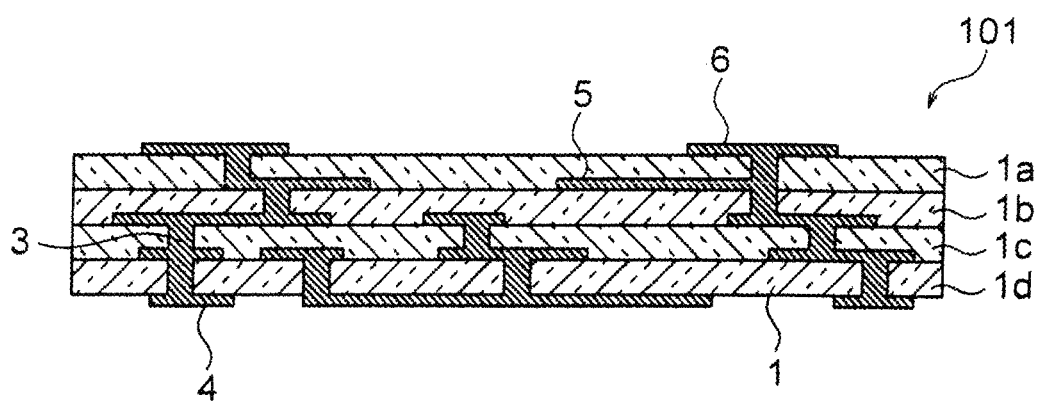
FIG. 1 is a schematic cross-sectional view of a glass ceramic wiring substrate according to an embodiment of the present invention.

Hereinafter, an embodiment of the present invention is described with reference to the drawings. In the drawings, the same members are designated by the same reference signs, and description thereof is partially omitted. In addition, the present invention is not limited to the following embodiments, and can be implemented with appropriate modifications within the scope of the object of the present invention. Furthermore, a duplicate description may be omitted as appropriate, but this does not limit the spirit of the invention.

First Embodiment

Hereinafter, one embodiment of the present invention is described taking a glass ceramic wiring substrate using a glass ceramic sintered body according to one embodiment of the present invention and a method for manufacturing the same as an example.

1. Glass Ceramic Wiring Substrate

FIG. 1 is a schematic cross-sectional view of a glass ceramic wiring substrate 101 of the present embodiment. FIG. 1 shows a cross-sectional view of the vicinity of the center of one of the basic structures arranged in a substrate at an arbitrary pitch and constituting a circuit.

As shown in FIG. 1, the glass ceramic wiring substrate 101 has an insulating base (insulating layers 1a to 1d) made of a glass ceramic sintered body 1, and wiring conductors (via conductors 3, mounting surface terminals 4, inner conductor layers 5 and surface conductor layers 6). That is, in FIG. 1, the glass ceramic wiring substrate 101 has the inner conductor layers 5 arranged with a predetermined pattern between the vertically adjacent insulating layers 1a to 1d, the surface conductor layers 6 arranged on the outer surfaces of the insulating layers 1a and 1d being the outermost layers, and the mounting surface terminals 4. Furthermore, the glass ceramic wiring substrate 101 has the via conductors 3 penetrating the insulating layers 1a to 1d and connecting the inner conductor layers 5 at different layers or connecting the surface conductor layer 6 and the inner conductor layer 5.

Although in the glass ceramic wiring substrate 101 of the embodiment shown in FIG. 1, the via conductors 3 connect the inner conductor layers 5 at different layers or connect the surface conductor layer 6 and the inner conductor layer 5, the present invention is not limited thereto.

In addition, each of the insulating layers 1a to 1d shown in FIG. 1 may be obtained by firing a single green sheet or by firing a laminate of a plurality of green sheets. Furthermore, the number of the laminated insulating layers 1a to 1d is not limited to the illustrated embodiment.

Besides, the outer shape and the size of the glass ceramic wiring substrate 101 are not particularly limited and can be appropriately set according to the application. Typically, the outer shape is a substantially rectangular parallelepiped shape, and the size is about 50 mm to 200 mm (length)×50 mm to 200 mm (width)×0.2 mm to 2.5 mm (thickness).

1-1. Glass Ceramic Sintered Body

The insulating layers 1a to 1d are made of the glass ceramic sintered body 1 according to one embodiment of the present invention.

That is, the ceramic sintered body according to the present embodiment is a glass ceramic sintered body containing crystallized glass, a alumina filler and silica, the content of the crystallized glass is 45 mass % to 85 mass %, the content of the alumina filler is 14.8 mass % to 50.1 mass % in terms of $Al_2O_3$, and the content of the silica is 0.2 mass % to 4.9 mass % in terms of $SiO_2$.

Due to the above composition, the glass ceramic sintered body according to the present embodiment has a small dielectric loss (tan δ), that is, a high Q value, in the quasi-millimeter wave band of 10 GHz to 30 GHz and the millimeter wave band of 30 to 300 GHz. The reason is that the Q value is the reciprocal of tan δ.

Furthermore, the glass ceramic sintered body according to the present embodiment can be fired at a low temperature of 1000° C. or lower. Thus, with the above glass ceramic sintered body, a conductor layer made of a low resistance metal such as Cu or Ag can be formed, and a glass ceramic wiring substrate suitable for a package in which various modules or semiconductor elements that use microwaves or millimeter waves are mounted can be obtained.

Hereinafter, the glass ceramic sintered body according to the present embodiment is described in detail.

1-1-1. Crystallized Glass

The crystallized glass contained in the glass ceramic sintered body according to the present embodiment is preferably a crystallized glass depositing a diopside type oxide crystal phase containing at least Mg, Ca and Si. The glass component having the above diopside type crystal phase as the main phase reduces the dielectric loss of the glass ceramic sintered body, that is, increases the Q value, in a high frequency region.

Here, the crystallized glass depositing a diopside type oxide crystal phase (hereinafter, also referred to as "diopside crystallized glass") is glass in which the diopside crystal is deposited as the main crystal by firing.

In the present embodiment, the content of the crystallized glass with respect to the total amount of the glass ceramic sintered body is 45 mass % to 85 mass %, and preferably 60 mass % to 75 mass %. By setting the content of the crystallized glass within the above range, the dielectric loss of the glass ceramic sintered body can be reduced.

The diopside crystallized glass according to the present embodiment contains at least Mg, Ca and Si, and preferably further contains one or more element selected from the group consisting of Al, Cu, Sr, Zn and Ti. Moreover, in addition to the above components, the diopside crystallized glass according to the present embodiment may contain other components as long as characteristics such as dielectric loss are not impaired.

In the diopside crystallized glass according to the present embodiment, Mg is a constituent component of the diopside crystal. The content of Mg, in terms of MgO, is preferably 11 mass % to 30 mass %, more preferably 12 mass % to 25 mass %, with respect to the total amount of the diopside crystallized glass. When the content of Mg is 11 mass % or more, crystals tend to be easily deposited. In addition, when the content of Mg is 30 mass % or less, vitrification during production tends to be easy.

In the diopside crystallized glass according to the present embodiment, Ca is a constituent component of the diopside crystal. The content of Ca, in terms of CaO, is preferably 10 mass % to 35 mass %, and more preferably 15 mass % to 30 mass %, with respect to the total amount of the diopside crystallized glass. When the content of Ca is 10 mass % or more, the dielectric loss tends to be reduced. Additionally, when the content of Ca is 35 mass % or less, vitrification during production tends to be easy.

In the diopside crystallized glass according to the present embodiment, Si is a glass network former and a constituent component of the diopside crystal. The content of Si, in terms of $SiO_2$, is preferably 40 mass % to 65 mass % and more preferably 45 mass % to 65 mass %, with respect to the total amount of the diopside crystallized glass. When the content of Si is 40 mass % or more, vitrification tends to be easy, and when the content of Si is 65 mass % or less, the density tends to be high.

In the diopside crystallized glass according to the present embodiment, Al is a component for adjusting the crystallinity of the glass. The content of Al, in terms of $Al_2O_3$, is preferably 0.5 mass % to 10 mass %, and more preferably 1 mass % to 5 mass %, with respect to the total amount of the diopside crystallized glass. When the content of Al is 0.5 mass % or more, crystallinity is improved and glass molding tends to be easy. Additionally, when the content of Al is 10 mass % or less, diopside crystals tend to be deposited easily.

In the diopside crystallized glass, Cu is a component for imparting electrons to Ag and suppressing diffusion into glass ceramic. The content of Cu, in terms of CuO, is preferably 0.01 mass % to 1.0 mass % with respect to the total amount of the diopside crystallized glass component. When the content of Cu is 0.01 mass % or more, the above-mentioned effects tend to be sufficiently exhibited. Additionally, when the content of Cu is 1.0 mass % or less, the dielectric loss tends to be reduced.

In the diopside crystallized glass component, Sr, Zn and Ti are components for facilitating vitrification. The content of each component, in terms of SrO, ZnO and $TiO_2$ respectively, is preferably 0 mass % to 25 mass %, and more preferably 0 mass % to 20 mass %, with respect to the total amount of the diopside crystallized glass component. When the content of each of these components is within the above range, the crystallinity tends to be improved, the amount of the deposited diopside tends to be increased, and the dielectric loss tends to be reduced.

1-1-2. Alumina Filler

The glass ceramic sintered body according to the present embodiment contains an alumina filler ($Al_2O_3$).

In the present embodiment, the alumina filler contributes to improvement of mechanical strength and adjustment of dielectric properties.

The shape of the alumina filler is not particularly limited, and an alumina filler having a plate-like, spherical, or irregular shape can be used. In addition, the average particle size of the alumina filler is not particularly limited either, and is preferably 2 µm to 10 µm more preferably 2 µm to 5 µm.

In the present embodiment, the content of the alumina filler, in terms of $Al_2O_3$, is 14.8 mass % to 50.1 mass %, and preferably 20 mass % to 33 mass %, with respect to the entire glass ceramic sintered body. By setting the content of the alumina filler within the above range, a sintered body having no defects such as voids and excellent in sinterability can be realized.

1-1-3. Silica

The glass ceramic sintered body according to the present embodiment contains silica ($SiO_2$). The glass ceramic sintered body promotes crystallization of a glass component having the diopside type crystal phase as the main phase, and contributes to reduction of dielectric loss of the glass ceramic sintered body.

The content of silica according to the present embodiment, in terms of $SiO_2$, is 0.2 mass % to 4.9 mass %, and preferably 0.4 mass % to 4.7 mass % with respect to the total amount of the glass ceramic sintered body.

1-1-4. High Dielectric Constant Material

The glass ceramic sintered body according to the present embodiment may include a high dielectric constant material such as a perovskite oxide like titanium oxide ($TiO_2$), calcium titanate ($CaTiO_3$), strontium titanate ($SrTiO_3$), $CaTiO_3$—$SrTiO_3$, and BaNdTiO-based oxide containing barium oxide (BaO), neodymium oxide ($Nd_2O_3$) and $TiO_2$. Accordingly, the temperature coefficient of resonant frequency ($\tau f$) of the dielectric constant is further improved and the specific dielectric constant is increased.

In addition, the glass ceramic sintered body according to the present embodiment has a good the temperature coefficient of resonant frequency ($\tau f$) due to the above composition. Specifically, the glass ceramic sintered body has a characteristic of being not prone to vary when the temperature is ranged from −40° C. to 85° C. in the quasi-millimeter wave band of 10 GHz to 30 GHz and the millimeter wave band of 30 to 300 GHz. Thus, the glass ceramic sintered body according to the present embodiment has excellent environmental performance.

The high dielectric constant material may be used alone or in combination of multiple types. The dielectric constant and the temperature coefficient of resonant frequency ($\tau f$) of the glass ceramic sintered body can be adjusted by changing the type, the combination of multiple types, and the content of the high-dielectric constant material.

The content of titanium oxide ($TiO_2$) according to the present embodiment, in terms of $TiO_2$, is 5 mass % to 17 mass %, and preferably 6 mass % to 15 mass %, with respect to the total amount of the glass ceramic sintered body.

The content of calcium titanate ($CaTiO_3$) according to the present embodiment, in terms of $CaTiO_3$, is 3 mass % to 15 mass %, and preferably 4 mass % to 11 mass %, with respect to the total amount of the glass ceramic sintered body.

The content of strontium titanate according to the present embodiment, in terms of $SrTiO_3$, is 4 mass % to 14 mass %, and preferably 6 mass % to 11 mass %, with respect to the total amount of the glass ceramic sintered body.

In the above, the predetermined glass component, the alumina filler, the silica and the high dielectric constant material have been described as the components constituting the glass ceramic sintered body according to the present embodiment. In addition to the above components, the glass ceramic sintered body according to the present embodiment may contain other components as long as the effects of the present invention are not impaired. In this case, the content of the components other than those mentioned above is preferably 10 mass % or less, and more preferably 5 mass % or less of the entire glass ceramic sintered body.

The components other than those mentioned above may include amorphous glass components, ceramic fillers other than the alumina fillers, oxides other than the above-mentioned oxides, and the like. The ceramics fillers other than the alumina fillers may include at least one material selected from the group consisting of magnesia, spinel, mullite, forsterite, steatite, cordierite, strontium feldspar, quartz, zinc silicate, zirconia and titania.

In addition, oxides other than the above-mentioned oxides include oxides of Mn, B, Li, Co, Ag, or Cu. An oxide of B in the glass ceramic sintered body is preferably 0 mass % to 3 mass % in terms of $B_2O_3$, an oxide of Li is preferably 0 mass % to 0.5% in terms of $Li_2O$, an oxide of Co is preferably 0 mass % to 0.2 mass % in terms of CoO, and an oxide of Ag is preferably 0 mass % to 0.3 mass % in terms of $Ag_2O$. Accordingly, the dielectric loss in the high frequency band of 10 GHz or higher can be reduced.

The glass ceramic sintered body according to the present embodiment preferably contains substantially no Fe except when Fe is unavoidably contained.

Moreover, the method of measuring various components contained in the glass ceramic sintered body according to the present embodiment may be a conventionally known method. For example, the measurement is performed by an analysis method using a fluorescent X-ray analyzer (XRF), or a method of melting a sample and analyzing the sample by using a high-frequency coupled plasma atomic emission spectrometer (ICP-AES) or a high-frequency inductively coupled plasma mass spectrometer (ICP-MS).

Although the preferred embodiment of the glass ceramic wiring substrate 101 according to the embodiment of the present invention has been described above, the present invention is not limited to the above embodiment.

In addition, the number of the insulating bases (insulating layers) provided on the wiring substrate, and the structure and material of the wiring conductors (inner conductor layers, surface conductor layers, via conductors, and the like) are not particularly limited. For example, the material of the wiring conductor may include Ag, an Ag—Pd alloy, Cu, Ni, and the like.

2. Manufacturing Method

Figure 2:
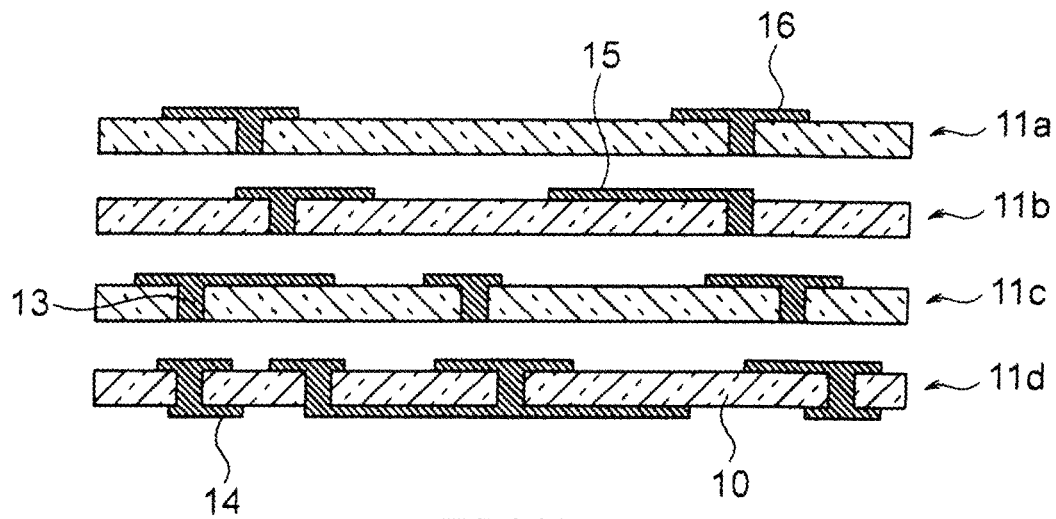
FIG. 2(S1) to FIG. 2(S3) are schematic cross-sectional views showing an example of the flow of a method for manufacturing a glass ceramic wiring substrate according to an embodiment of the present invention.
Figure 2:
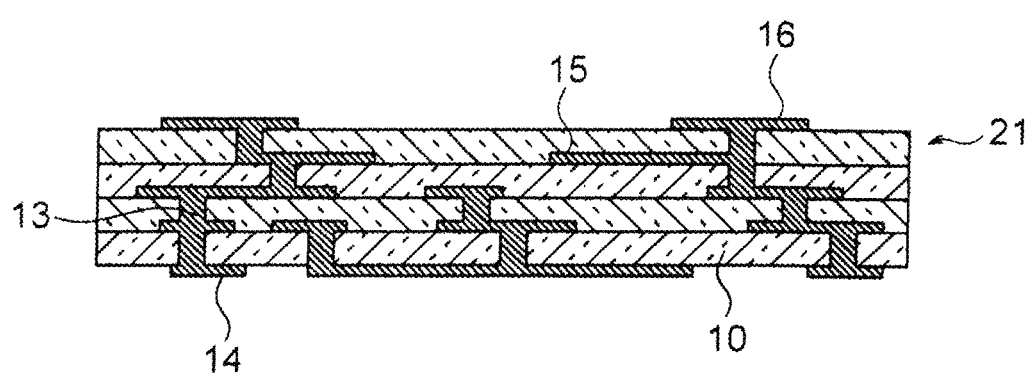
Figure 2:
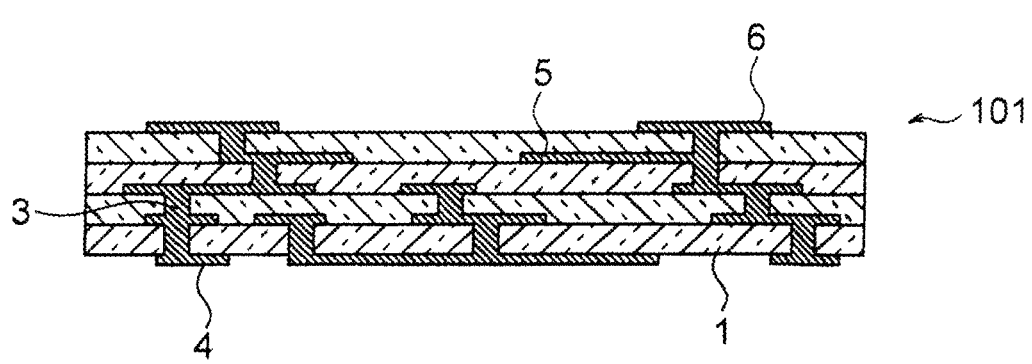

Next, a preferred embodiment of the method for manufacturing the glass ceramic wiring substrate according to the present embodiment is described with reference to the drawings. FIG. 2(S1) to FIG. 2(S3) are schematic cross-sectional views for describing the flow of the method for manufacturing the glass ceramic wiring substrate. In particular, FIG. 2(S1) is a schematic cross-sectional view of green sheets for glass ceramic wiring substrate before substrate firing on which various patterns have been formed. Additionally, FIG. 2(S2) is a schematic cross-sectional view of a glass ceramic wiring substrate laminate before firing, which is formed by laminating the green sheets for glass ceramic wiring substrate prepared in FIG. 2(S1). Furthermore, FIG. 2(S3) is a schematic cross-sectional view of the glass ceramic wiring substrate obtained by firing the glass ceramic wiring substrate laminate of FIG. 2(S2).

The manufacturing of the glass ceramic wiring substrate according to the present embodiment is the same as that of the conventional glass ceramic wiring substrate. First, as shown in FIG. 2(S1), green sheets for glass ceramic wiring substrate 11a to 11d, on which at least one of the via conductor pattern 13, the mounting surface terminal pattern 14, the inner conductor pattern 15, and the surface conductor pattern 16 has been formed, are manufactured.

Specifically, a green sheet 10 is manufactured and various conductor patterns 13, 14, 15 and 16 are formed by the following method.

First, at least crystallized glass, an alumina filler, and silica are prepared as raw materials for the components constituting the glass ceramic sintered body. In addition, a high dielectric constant material may also be prepared.

Moreover, the crystallized glass may be used alone or in combination of multiple types, and in any case, commercially available crystallized glass or manufactured crystallized glass can be used.

As the alumina filler, silica, and the high dielectric constant material, commercially available products or manufactured products can be used.

The particle size of the crystallized glass is not particularly limited and is preferably 0.5 μm to 3 μm.

The shape of the alumina filler is not particularly limited, and an alumina filler having a plate-like, spherical, or irregular shape can be used. In addition, the average particle size of the alumina filler is not particularly limited either, and is preferably 2 μm to 10 μm more preferably 2 μm to 5 μm.

The particle size of silica is not particularly limited, and is preferably 0.2 μm to 2 μm.

The particle size of the high dielectric constant material is not particularly limited, and is preferably 0.2 μm to 2 μm.

Moreover, the silica used in the present embodiment may be α-$SiO_2$ or β-$SiO_2$, and is preferably α-$SiO_2$.

Next, the crystallized glass, the alumina filler, silica and the high dielectric constant material as required are weighed according to the composition ratio of the glass ceramic sintered body to be manufactured.

In the present embodiment, the mixing method is not particularly limited. For example, water, an organic solvent, and a binder, a plasticizer, a dispersant, etc. as required are added, and then subjected to wet mixing with a ball mill or the like. In this way, the mixture of the above raw materials (raw material powder) is made into a paint to prepare a green sheet paste.

The green sheet paste may be an organic paint obtained by kneading the raw material powder and an organic vehicle, or may be an aqueous paint. The amount of the solvent or additive to be added is not particularly limited and may be a normal amount. The amount can be appropriately selected depending on the mixing device that is used, the film thickness of the sheet formed in the subsequent step, and the like.

For example, when an organic vehicle is used, the content of the binder contained in the organic vehicle of the green sheet paste may be about 5 to 15% by weight and the content of the solvent contained in the organic vehicle may be about 50 to 150% by weight, with respect to 100% by weight of the raw material powder. In addition, additives such as various dispersants and plasticizers, which are added as necessary, are preferably 10% by weight or less in total content.

Moreover, the binder may be, for example, a polyvinyl butyral resin, a methacrylic acid resin, or the like. The plasticizer may be, for example, dibutyl phthalate or the like. The solvent may be, for example, toluene, methyl ethyl ketone, or the like.

Next, the obtained green sheet paste is formed into a film on a support such as a polyethylene terephthalate (PET) sheet, and the green sheet 10 is formed on the support.

As the film forming method, a molding method such as a doctor blade method or a calendar roll can be used.

The green sheet 10 manufactured by the above method is prepared, various conductor patterns (the inner conductor pattern 15, the surface conductor pattern 16, the mounting surface terminal pattern 14, the via conductor pattern 13, and the like) are formed, and the green sheets for glass ceramic wiring substrate 11a to 11d are manufactured.

Specifically, first, as shown in FIG. 2(S1), through holes (via hole) are formed at predetermined positions of the prepared green sheet 10, and via conductor patterns 13 are formed by filling the through holes with a conductor paste. In addition, the conductor paste is printed in a predetermined pattern on the surface of the inner layer of the green sheet 10 to form the inner conductor patterns 15. Furthermore, the surface conductor patterns 16 and the mounting surface terminal patterns 14 are formed on the outermost green sheet 10. Moreover, electronic elements (inductors, capacitors, and the like) may be formed in the green sheet 10 as necessary.

The conductive paste used for the formation of the conductive pattern can be prepared, for example, by kneading a conductive material consisting of various conductive metals or alloys such as Ag, Ag—Pd alloy, Cu, and Ni with an organic vehicle. The organic vehicle used for the conductive paste contains a binder and a solvent as main components. There is no particular limitation on the compounding ratio of the binder, the solvent and the conductive material. For example, the binder can be added in an amount of 1 mass % to 15 mass % and the solvent in an amount of 10 mass % to 50 mass %, with respect to the conductive material. Additives selected from various dispersants, plasticizers and the like may be added to the conductive paste as needed.

Next, as shown in FIG. 2(S2), the green sheets for glass ceramic wiring substrate 11a, 11b, 11c and 11d are laminated in this order to form a glass ceramic wiring substrate laminate 21.

Subsequently, the glass ceramic wiring substrate laminate 21 is pressed, and then is fired in an air atmosphere of 800° C. to 1000° C. or in a low-oxygen atmosphere after the components such as the organic vehicle contained in the glass ceramic wiring substrate laminate 21 are removed in a heated air atmosphere, and thereby the glass ceramic wiring substrate 101 as shown in FIG. 2(S3) is obtained. The low-oxygen atmosphere means an atmosphere having a lower oxygen partial pressure than the air. The low-oxygen atmosphere may include, for example, an inert gas atmosphere such as nitrogen or argon, an atmosphere in which an inert gas such as nitrogen is mixed in the air, a mixed gas atmosphere of nitrogen and hydrogen, a vacuum atmosphere, and the like.

At this time, a diopside type crystal phase represented by $CaMgSi_2O_6$ is deposited in the green sheet by firing, and a dense and low-loss glass ceramic sintered body is realized.

In particular, in the present embodiment, it is considered that silica added together with the crystallized glass acts to promote the crystallization of the glass, and as a result, the reduction in the dielectric loss is realized, and thereby a glass ceramic sintered body for high frequencies, especially microwaves can be obtained.

Besides, the via conductor pattern 13 in the via hole becomes the via conductor 3, the mounting surface terminal pattern 14 becomes the mounting surface terminal 4, the inner conductor pattern 15 becomes the inner conductor layer 5, and the surface conductor pattern 16 becomes the surface conductor layer 6.

Furthermore, in some cases, the surface conductor pattern may be plated. As the plating layer, a plating layer containing at least one metal selected from Ni, Sn, Pd, Au, Pt and the like may be used.

3. Summary of the Present Embodiment

The glass ceramic sintered body of the present embodiment is a glass ceramic sintered body containing crystallized glass, an alumina filler, and silica. The content of the crystallized glass is 45 mass % to 85 mass %, the content of the alumina filler is 14.8 mass % to 50.1 mass % in terms of $Al_2O_3$, and the content of the silica is 0.2 mass % to 4.9 mass % in terms of $SiO_2$.

The glass ceramic sintered body of the present embodiment has a small dielectric loss in a high frequency band of 10 GHz or higher.

Second Embodiment

Next, another embodiment different from the embodiment described above is described taking a glass ceramic wiring substrate using the glass ceramic sintered body according to the present invention and a method for manufacturing the same as an example. Moreover, except for the parts shown below, the second embodiment has the same configuration and operational effects as the first embodiment, and duplicate description is partially omitted.

Figure 3:
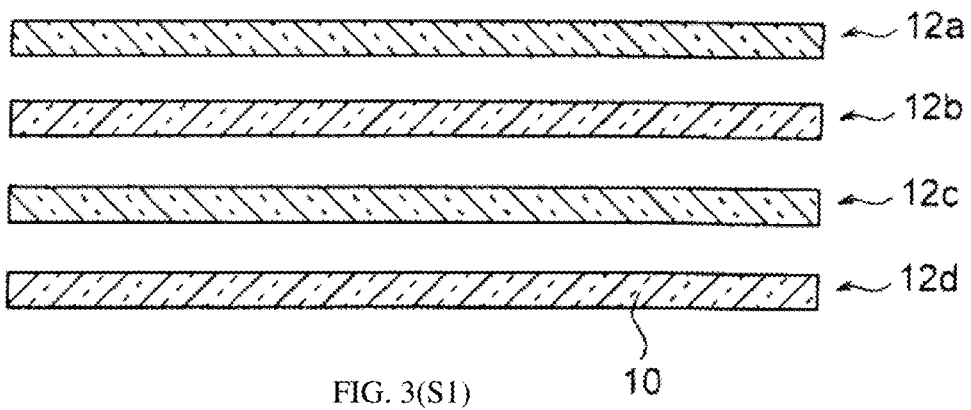
FIG. 3(S1) to FIG. 3(S3) are schematic cross-sectional views showing an example of the flow of a method for manufacturing a glass ceramic substrate according to another embodiment of the present invention.
Figure 3:
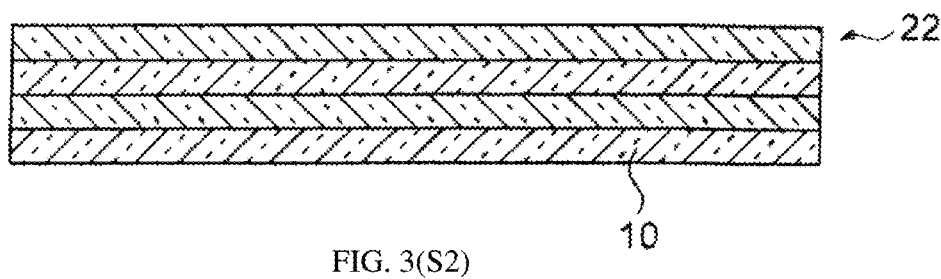
Figure 3:
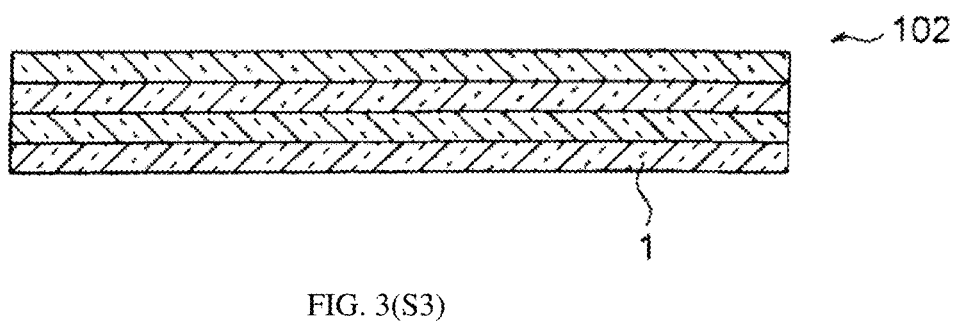

FIG. 3 is a cross-sectional view for describing the method for manufacturing the glass ceramic substrate according to the second embodiment. In particular, FIG. 3(S1) is a schematic cross-sectional view of green sheets for glass ceramic substrate before firing. Additionally, FIG. 3(S2) is a schematic cross-sectional view of a glass ceramic substrate laminate before firing, which is formed by laminating the green sheets for glass ceramic substrate prepared in FIG. 3(S1). Furthermore, FIG. 3(S3) is a schematic cross-sectional view of the glass ceramic substrate obtained by firing the glass ceramic substrate laminate of FIG. 3(S2).

In the present embodiment, first, green sheets 10 are prepared as shown in FIG. 3(S1). Specifically, the manufacturing method of the green sheet 10 may be the same as the manufacturing method described above. Then, as shown in FIG. 3(S1), green sheets for glass ceramic substrate 12a, 12b, 12c and 12d are laminated in this order to obtain a glass ceramic substrate laminate 22. Subsequently, the glass ceramic substrate laminate 22 is pressed, and then is fired after the components such as the organic vehicle contained in the glass ceramic substrate laminate 22 are removed in a heated air atmosphere, and thereby a glass ceramic substrate 102 as shown in FIG. 3(S3) is obtained.

The glass ceramic substrate 102 according to the present embodiment is made of the glass ceramic sintered body 1 of the present invention.

Although the embodiments of the present invention have been described above, the present invention is not limited to the above embodiments, and can be implemented in various other embodiments without departing from the scope of the present invention.

For example, in the second embodiment, the glass ceramic substrate is manufactured by laminating the green sheets and forming the glass ceramic laminate. However, the glass ceramic substrate may also be obtained by firing a green sheet having a predetermined thickness as a single plate without laminating green sheets.

EXAMPLES

Hereinafter, the present invention is described in more detail with reference to examples and comparative examples, but the present invention is not limited to the following examples.

(Manufacturing Example 1) Examples 1 to 7, 26 to 29, Comparative Examples 1 and

Glass powder (crystallized glass powder depositing diopside, which contains $SiO_2$=45 mass %, CaO=17 mass %, MgO=15 mass %, $Al_2O_3$=5 mass %, SrO=18 mass %), an alumina filler (manufactured by Kojundo Chemical Laboratory, α-alumina 3N) and silica (manufactured by Kojundo Chemical Laboratory, $SiO_2$ 3N) are prepared, and the materials are weighed respectively so that the composition ratio of each sample reaches the value shown in Table 1, Table 5 and Table 6.

Then, 19.4 parts by mass of an acrylic resin, 59.1 part by mass of toluene, 3 parts by mass of ethanol, and 6.5 parts by mass of a plasticizer (butyl butylphthalyl glycolate) are mixed to prepare an organic vehicle.

Then, the weighed glass powder, alumina filler, and silica are mixed with the prepared organic vehicle and mixed for 24 hours using a ball mill to prepare a coating material for forming the green sheet for substrate.

The coating material for the green sheet for substrate is formed into a film on a polyethylene terephthalate film by a doctor blade method to form the green sheet for substrate. Moreover, the thickness of the green sheet is adjusted so as to be 50 μm after firing. Subsequently, 10 green sheets are laminated and pressed at 74 MPa, and then fired at 900° C. for 30 minutes to manufacture a glass ceramic sintered body.

Then, the dielectric loss (tan δ), the specific dielectric constant (εr) and the temperature coefficient of resonant frequency (τf) of the obtained glass ceramic sintered body are evaluated. The results are shown in Table 1. In addition, X-ray diffraction is measured in Example 4 and Comparative example 2. Moreover, various evaluation items are evaluated by the following methods.

[Composition Evaluation]

The composition of the obtained glass ceramic sintered body is analyzed. The composition analysis is performed by an analyzing method using a fluorescent X-ray analyzer (XRF). As a result, it is confirmed that the composition of each sintered body is equal to the charged composition (compositions in Table 1, Table 5 and Table 6).

[Specific Dielectric Constant and Dielectric Loss]

Regarding specific dielectric constant (εr) and dielectric loss (tan δ), the characteristics at a frequency of about 28 GHz are evaluated by the cut-off cylindrical waveguide method (JIS R1660-1). The glass ceramic sintered body is processed into a predetermined shape and evaluated. Specifically, the glass ceramic sintered body is cut out from the sintered substrate so as to have a plate shape of 10×10×0.7 mm, and the cut out plate-shaped sample is clamped in a TE011 mode cut-off cylindrical resonator for measurement. In order to measure the state of the resonance peak of the cut-off cylindrical resonator, it is connected to a network analyzer N5247A manufactured by Keysight Technology Co., Ltd. and a computer for analysis, and the measurement is performed by this series of systems.

[The Temperature Coefficient of Resonant Frequency]

The temperature coefficient of resonant frequency τf is obtained by measuring the temperature change rate of the resonance frequency in a temperature range of −25° C. to 85° C. at the resonance frequency of 11 GHz to 15 GHz according to JIS R1627.

[X-Ray Diffraction]

The X-ray diffraction is measured by using X'Pert Pro, an X-ray (Cu-Kα-ray) diffractometer manufactured by PANalytical, at 2θ/θ=16 to 40 deg. The X-ray generation conditions are as follows: 45 kV-40 mA, scan width 0.033°, and scan speed 0.13°/s. The X-ray detection conditions of the incident side optical system are as follows: Ni filter: 10 μm, solar slit: 0.04 rad, divergence slit: ½°, mask: 10 mm, and anti-scatter slit: 1°. The X-ray detection conditions of the receiving side optical system are as follows: anti-scatter slit: 5.5 mm, solar slit: 0.04 rad, and Ni filter: 20 μm.

(Manufacturing Example 2) Examples 8 to 14, Comparative Examples 3 and 4

A glass ceramic sintered body is obtained in the same manner as in Manufacturing example 1, except that titanium oxide is prepared in addition to the glass powder, the alumina filler and silica described in Manufacturing example 1, and the materials are weighed respectively so that the composition ratio of each sample reaches the value shown in Table 2.

Then, the dielectric loss (tan δ), the specific dielectric constant (εr) and the temperature coefficient of resonant frequency (τf) of the obtained glass ceramic sintered body are evaluated. The results are shown in Table 2. The composition of the obtained glass ceramic sintered body is analyzed. The composition analysis is performed by an analyzing method using a fluorescent X-ray analyzer (XRF). As a result, it is confirmed that the composition of each sintered body is equal to the charged composition (composition in Table 2).

(Manufacturing Example 3) Examples 15 to 21, Comparative Examples 5 and 6

A glass ceramic sintered body is obtained in the same manner as in Manufacturing example 1, except that calcium titanate is prepared in addition to the glass powder, the alumina filler and silica described in Manufacturing example 1, and the materials are weighed respectively so that the composition ratio of each sample reaches the value shown in Table 3.

Then, the dielectric loss (tan δ), the specific dielectric constant (εr) and the temperature coefficient of resonant frequency (τf) of the obtained glass ceramic sintered body are evaluated. The results are shown in Table 3. The composition of the obtained glass ceramic sintered body is analyzed. The composition analysis is performed by an analyzing method using a fluorescent X-ray analyzer (XRF). As a result, it is confirmed that the composition of each sintered body is equal to the charged composition (composition in Table 3).

(Manufacturing Example 4) Examples 22 to 25, Comparative Examples 7 to 9

A glass ceramic sintered body is obtained in the same manner as in Manufacturing example 1, except that strontium titanate is prepared in addition to the glass powder, the alumina filler and silica described in Manufacturing example 1, and the materials are weighed respectively so that the composition ratio of each sample reaches the value shown in Table 4. Moreover, in Comparative example 9, $B_2O_3$, $Li_2O$, CoO and $Ag_2O$ are further prepared, and the materials are weighed respectively so as to reach the values shown in Table 7.

Then, the dielectric loss (tan δ), the specific dielectric constant (εr) and the temperature coefficient of resonant frequency (τf) of the obtained glass ceramic sintered body are evaluated. The results are shown in Table 4. The composition of the obtained glass ceramic sintered body is analyzed. The composition analysis is performed by an analyzing method using a fluorescent X-ray analyzer (XRF). As a result, it is confirmed that the composition of each sintered body is equal to the charged composition (composition in Table 4 or Table 7).

TABLE 1

| | Glass ceramic composition (mass %) | | | tanδ | εr | τf |
|---|---|---|---|---|---|---|
| | Crystallized glass | $Al_2O_3$ | $SiO_2$ | (−, $10 \times ^{-4}$) | (−) | (ppm/K) |
| Example 1 | 67.2 | 32.0 | 0.8 | 2.22 | 8.1 | −58.6 |
| Example 2 | 67.5 | 30.9 | 1.6 | 1.38 | 8.1 | −58.4 |
| Example 3 | 67.7 | 30.1 | 2.2 | 0.97 | 8.0 | −58.0 |
| Example 4 | 67.9 | 29.2 | 2.9 | 1.02 | 8.0 | −57.7 |
| Example 5 | 68.2 | 28.2 | 3.6 | 1.06 | 7.9 | −57.4 |
| Example 6 | 68.4 | 27.2 | 4.4 | 1.22 | 7.9 | −57.0 |
| Example 7 | 68.6 | 26.6 | 4.8 | 2.04 | 7.8 | −56.5 |
| Comparative example 1 | 69.0 | 25.4 | 5.6 | 3.28 | 7.7 | −56.1 |
| Comparative example 2 | 67.0 | 32.9 | 0.1 | 3.13 | 8.2 | −59.0 |

TABLE 2

| | Glass ceramic composition (mass %) | | | | tanδ | εr | τf |
|---|---|---|---|---|---|---|---|
| | Crystallized glass | $Al_2O_3$ | $SiO_2$ | $TiO_2$ | (−, $10 \times ^{-4}$) | (−) | (ppm/K) |
| Example 8 | 66.4 | 26.6 | 1.6 | 5.4 | 2.14 | 8.9 | −37.4 |
| Example 9 | 67.0 | 24.3 | 3.4 | 5.3 | 1.46 | 8.7 | −36.4 |
| Example 10 | 67.2 | 23.2 | 4.2 | 5.4 | 1.92 | 8.6 | −35.9 |
| Example 11 | 72.7 | 18.8 | 3.4 | 5.1 | 1.53 | 8.5 | −36.7 |
| Example 12 | 60.8 | 19.1 | 3.2 | 16.9 | 2.87 | 10.9 | 9.7 |
| Example 13 | 64.8 | 27.9 | 3.3 | 4.0 | 2.09 | 8.5 | −41.9 |
| Example 14 | 58.3 | 15.3 | 3.2 | 23.2 | 2.93 | 12.4 | 35.4 |
| Comparative example 3 | 69.3 | 25.3 | 0.1 | 5.3 | 3.39 | 9.0 | −37.9 |
| Comparative example 4 | 69.1 | 18.7 | 6.8 | 5.4 | 3.27 | 8.3 | −34.3 |

TABLE 3

| | Glass ceramic composition (mass %) | | | | tanδ | εr | τf |
|---|---|---|---|---|---|---|---|
| | Crystallized glass | $Al_2O_3$ | $SiO_2$ | $CaTiO_3$ | (−, $10 \times ^{-4}$) | (−) | (ppm/K) |
| Example 15 | 67.7 | 24.9 | 1.7 | 5.7 | 1.78 | 9.1 | −23.4 |
| Example 16 | 68.2 | 22.8 | 3.3 | 5.7 | 1.45 | 8.9 | −22.4 |
| Example 17 | 68.6 | 21.0 | 4.6 | 5.8 | 1.53 | 8.8 | −21.7 |

TABLE 3-continued

| | Glass ceramic composition (mass %) | | | | | |
|---|---|---|---|---|---|---|
| | Crystallized glass | Al$_2$O$_3$ | SiO$_2$ | CaTiO$_3$ | tan δ (-, 10 × $^{-4}$) | εr (-) | τf (ppm/K) |
| Example 18 | 65.2 | 27.1 | 4.2 | 3.5 | 1.42 | 8.5 | -35.4 |
| Example 19 | 63.8 | 17.4 | 4.1 | 14.7 | 2.87 | 10.9 | 32.9 |
| Example 20 | 65.2 | 28.3 | 4.2 | 2.3 | 1.39 | 8.3 | -43.1 |
| Example 21 | 62.7 | 16.9 | 4.1 | 16.3 | 2.97 | 11.3 | 42.8 |
| Comparative example 5 | 66.1 | 28.2 | 0.1 | 5.6 | 3.69 | 9.3 | -24.5 |
| Comparative example 6 | 67.9 | 20.4 | 5.9 | 5.8 | 3.42 | 8.7 | -21.1 |

TABLE 4

| | Glass ceramic composition (mass %) | | | | | |
|---|---|---|---|---|---|---|
| | Crystallized glass | Al$_2$O$_3$ | SiO$_2$ | SrTiO$_3$ | tan δ (-, 10 × $^{-4}$) | εr (-) | τf (ppm/K) |
| Example 22 | 65.1 | 23.2 | 1.6 | 10.1 | 1.72 | 10.0 | 11.4 |
| Example 23 | 65.8 | 19.9 | 4.0 | 10.2 | 1.58 | 9.7 | 12.8 |
| Example 24 | 66.1 | 18.9 | 4.7 | 10.3 | 1.49 | 9.7 | 13.3 |
| Example 25 | 69.0 | 20.6 | 4.7 | 5.8 | 1.40 | 8.7 | -17.6 |
| Comparative example 7 | 64.6 | 25.2 | 0.1 | 10.1 | 3.51 | 10.2 | 10.4 |
| Comparative example 8 | 64.6 | 17.6 | 7.4 | 10.3 | 3.26 | 9.4 | 14.6 |

TABLE 5

| | Glass ceramic composition (mass %) | | | tan δ | | τf |
|---|---|---|---|---|---|---|
| | Crystallized glass | Al$_2$O$_3$ | SiO$_2$ | (-, 10 × $^{-4}$) | εr (-) | (ppm/K) |
| Example 26 | 46.5 | 49.0 | 4.5 | 1.77 | 8.2 | -59.4 |
| Example 27 | 83.7 | 15.1 | 1.2 | 2.60 | 7.8 | -56.2 |

TABLE 6

| | Glass ceramic composition (mass %) | | | tan δ | | τf |
|---|---|---|---|---|---|---|
| | Crystallized glass | Al$_2$O$_3$ | SiO$_2$ | (-, 10 × $^{-4}$) | εr (-) | (ppm/K) |
| Example 28 | 80.2 | 15.1 | 4.7 | 2.11 | 7.6 | -54.9 |
| Example 29 | 50.1 | 49.0 | 0.9 | 2.87 | 8.5 | -60.9 |

TABLE 7

| | Glass ceramic composition (mass %) | | | | | | | | tan δ | εr | τf |
|---|---|---|---|---|---|---|---|---|---|---|---|
| | Crystallized glass | Al$_2$O$_3$ | SiO$_2$ | SrTiO$_3$ | B$_2$O$_3$ | Li$_2$O | CoO | Ag$_2$O | (-, 10 × $^{-4}$) | (-) | (ppm/K) |
| Comparative example 9 | 65.8 | 23.6 | 1.3 | 5.2 | 1.6 | 0.3 | 1.4 | 0.8 | 3.14 | 8.8 | -27.5 |

From Table 1, it can be confirmed that compared with a case in which the content of silica (SiO$_2$) is less than 0.2 mass % in terms of SiO$_2$ (Comparative example 2), when the content of silica (SiO$_2$) is 0.2 mass % or more in terms of SiO$_2$ (Examples 1 to 7), the dielectric loss (tan δ) is smaller and the temperature characteristic (τf) is better.

From Table 5, it can be confirmed that the dielectric loss (tan δ) is also small when the content of the crystallized glass is 46.5 mass % (Example 26) and when the content of the crystallized glass is 83.7 mass % (Example 27).

From Table 6, it can be confirmed that the dielectric loss (tan δ) is also small when the content of the alumina filler is 15.1 mass % (Example 28) and when the content of the alumina filler is 49.0 mass % (Example 29).

Figure 4:
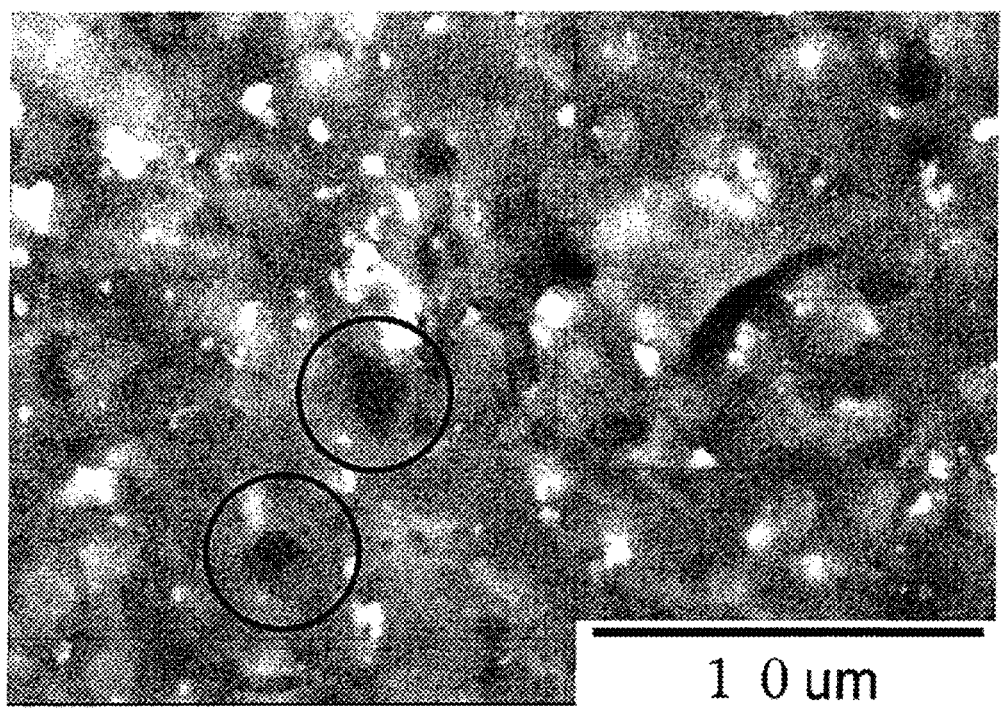
FIG. 4 is a SEM photograph of a cross section of a ceramic sintered body of Example 18 of the present invention.

FIG. 4 is a SEM photograph (5,000 times) of the cross section of the glass ceramic sintered body of Example 18. The glass ceramic sintered body of Example 18 is obtained by firing a mixture of the crystallized glass, the alumina filler and silica. The crystallized glass softens and fills the voids during firing. Accordingly, after sintering, the glass covers the periphery of the alumina filler and the like, as shown in FIG. 4. In addition, in FIG. 4, the presence of silica particles can be confirmed separately from the glass and the alumina filler. In FIG. 4, the parts surrounded by black circles are silica particles.

Figure 5:
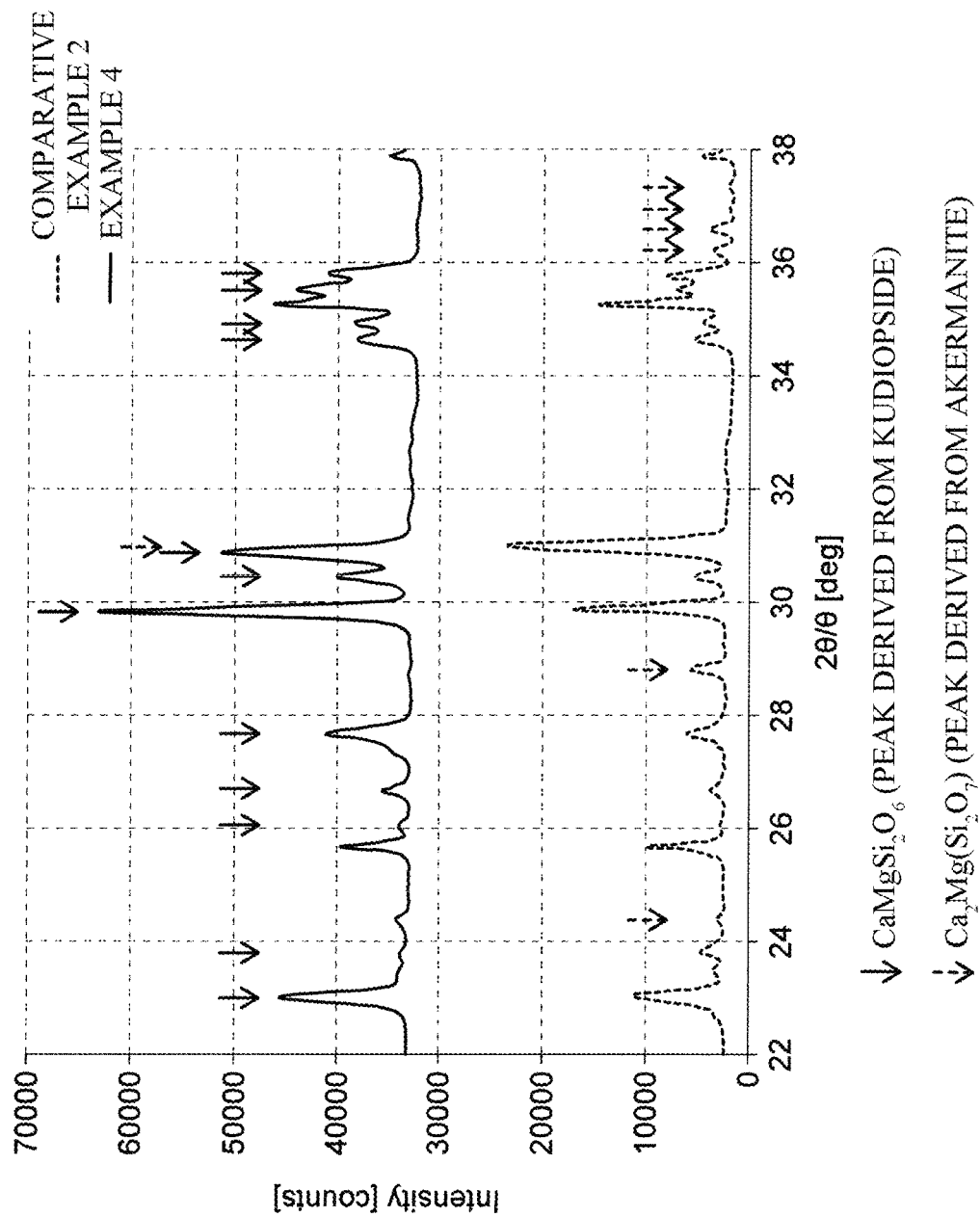
FIG. 5 is an XRD pattern of Example 4 and an XRD pattern of Comparative example 2 of the present invention.

As shown in FIG. 5, from the X-ray diffraction spectrum of Example 4, the peaks confirmed are mainly derived from diopside, and from the spectrum of Comparative example 2, peaks derived from akermanite in addition to diopside can be confirmed.

Thus, in Examples 1 to 7 and Examples 26 to 29, it is considered that due to the high silica content, the diopside type crystal phase (CaMgSi$_2$O$_6$) is deposited instead of the akermanite (Ca$_2$Mg(Si$_2$O$_7$)), and thereby the dielectric loss is reduced.

On the other hand, in Comparative example 2, it is considered that due to the low silica content, akermanite is formed in addition to the diopside type crystal phase, which causes an increase in the dielectric loss.

From Table 1, it can be confirmed that compared with a case in which the content of silica (SiO$_2$) is more than 4.9 mass % in terms of SiO$_2$ (Comparative example 1), when the content of silica (SiO$_2$) is 4.9 mass % or less in terms of SiO$_2$ (Examples 1 to 7), the dielectric loss (tan δ) is smaller.

From Tables 1 to 4, it can be confirmed that by including high dielectric materials (TiO$_2$, CaTiO$_3$ and SrTiO$_3$), the specific dielectric constant (εr) and the temperature coefficient of resonant frequency (τf) are improved.

From Table 7, it can be confirmed that the dielectric loss (tan δ) is larger when 1.4 mass % of CoO and 0.8 mass % of Ag$_2$O are contained.

Manufacturing Example 5

[Manufacture of Glass Ceramic Wiring Substrate]

A coating material for the green sheet for substrate is prepared in the same manner as in Example 1.

The prepared coating material for the green sheet for substrate is formed into a film on a polyethylene terephthalate film by a doctor blade method to form a plurality of green sheets for substrate. Moreover, the thickness of the green sheet is adjusted so as to be 25 μm after firing.

Subsequently, a surface layer conductor pattern (a surface conductor pattern or a mounting surface terminal pattern) corresponding to a desired circuit is formed on the green sheet for surface layer by screen printing. Moreover, in this example, the surface conductor pattern and the mounting surface terminal pattern are formed by printing a silver paste in a predetermined pattern on the outermost green sheet for substrate.

In addition, regarding the green sheets other than the green sheet for surface layer, the conductor pattern of the inner layer (such as the inner conductor pattern or the via conductor pattern) is also formed by screen printing corresponding to the desired circuit. Moreover, in this example, the via conductor pattern is formed by forming a through hole (via hole) at a predetermined position of each green sheet for substrate and filling the hole with a silver paste. Furthermore, the inner conductor pattern is formed by printing a silver paste in a predetermined pattern on the surface of the inner layer of the green sheet for substrate.

Subsequently, the above green sheets are laminated in a predetermined order, pressed at 74 MPa and then fired at 900° C. for 2 hours in the air to obtain the multi-layered glass ceramic wiring substrate 101 having the cross-sectional structure shown in FIG. 1 and including the via conductor 3, the surface terminal 4, the inner conductor 5, and the surface conductor 6.

Moreover, the total thickness of the glass ceramic wiring substrate after firing is 0.20 mm, and the thickness of the outermost layer portion on which the surface conductor 6 is formed is 25 μm. Subsequently, nickel is applied as a base on the surface conductor and then gold plating is performed.

It is confirmed that the glass ceramic wiring substrate obtained as above has a small dielectric loss in the high frequency region and can be fired at a low temperature of 1000° C. or lower by using a low resistance metal such as Ag as the conductor layer.

INDUSTRIAL APPLICABILITY

According to the present invention, a glass ceramic sintered body having a small dielectric loss in a high frequency band of 10 GHz or higher and stable characteristics against temperature variation and a wiring substrate using the same can be provided.

What is claimed is:

1. A glass ceramic sintered body comprising crystallized glass, an alumina filler, and α-$SiO_2$,
    wherein the content of the crystallized glass is 60 mass % to 85 mass %,
    the crystallized glass has a deposit of a diopside type oxide crystal phase containing at least Mg, Ca and Si,
    the content of the alumina filler is 20 mass % to 50.1 mass % in terms of $Al_2O_3$,
    the content of the α-$SiO_2$ is 0.2 mass % to 4.9 mass % in terms of $SiO_2$, and
    the particle size of α-$SiO_2$ is 0.2 μm to 2 μm.

2. The glass ceramic sintered body according to claim 1, further comprising at least one titanium compound selected from the group consisting of titanium oxide, calcium titanate and strontium titanate.

3. The glass ceramic sintered body according to claim 1, further comprising at least one of titanium oxide and calcium titanate.

4. A wiring substrate having an insulating base and a wiring conductor,
    wherein the insulating base consists of the glass ceramic sintered body according to claim 1.

5. A wiring substrate having an insulating base and a wiring conductor,
    wherein the insulating base consists of the glass ceramic sintered body according to claim 2.

6. A wiring substrate having an insulating base and a wiring conductor,
    wherein the insulating base consists of the glass ceramic sintered body according to claim 3.

7. A glass ceramic sintered body comprising crystallized glass, an alumina filler, and α-$SiO_2$,
    wherein the content of the crystallized glass is 45 mass % to 85 mass %,
    the crystallized glass has a deposit of a diopside type oxide crystal phase containing at least Mg, Ca and Si,
    the content of the alumina filler is 20 mass % to 33 mass % in terms of $Al_2O_3$,
    the content of the α-$SiO_2$ is 0.2 mass % to 4.9 mass % in terms of $SiO_2$, and
    the particle size of α-$SiO_2$ is 0.2 μm to 2 μm.

8. The glass ceramic sintered body according to claim 1, wherein the content of the alumina filler is 20 mass % to 33 mass % in terms of $Al_2O_3$.

9. The glass ceramic sintered body according to claim 1, wherein the crystallized glass contains with respect to the total amount of the crystallized glass:
    11 mass % to 30 mass % of Mg in terms of MgO;
    10 mass % to 35 mass % of Ca in terms of CaO; and
    40 mass % to 65 mass % of Si in terms of $SiO_2$.

10. The glass ceramic sintered body according to claim 7, wherein the crystallized glass contains with respect to the total amount of the crystallized glass:
    11 mass % to 30 mass % of Mg in terms of MgO;
    10 mass % to 35 mass % of Ca in terms of CaO; and
    40 mass % to 65 mass % of Si in terms of $SiO_2$.

11. The glass ceramic sintered body according to claim 9, wherein the crystallized glass further contains one or more elements selected from the group consisting of Al, Cu, Sr, Zn and Ti.

12. The glass ceramic sintered body according to claim 10, wherein the crystallized glass further contains one or more elements selected from the group consisting of Al, Cu, Sr, Zn and Ti.

13. The glass ceramic sintered body according to claim 1, consisting of the crystallized glass, the alumina filler and α-$SiO_2$.

14. The glass ceramic sintered body according to claim 2, consisting of the crystallized glass, the alumina filler, α-$SiO_2$ and the at least one titanium compound.

15. The glass ceramic sintered body according to claim 7, consisting of the crystallized glass, the alumina filler and α-$SiO_2$.

* * * * *